(12) United States Patent
Lopes et al.

(10) Patent No.: US 8,154,053 B2
(45) Date of Patent: Apr. 10, 2012

(54) PROGRAMMABLE METAL ELEMENTS AND PROGRAMMABLE VIA ELEMENTS IN AN INTEGRATED CIRCUIT

(75) Inventors: Antonio S. Lopes, Mineola, NY (US); Steven Burstein, Smithtown, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 498 days.

(21) Appl. No.: 12/389,568

(22) Filed: Feb. 20, 2009

(65) Prior Publication Data

US 2010/0213515 A1    Aug. 26, 2010

(51) Int. Cl.
*H01L 27/118* (2006.01)
*H01L 25/00* (2006.01)

(52) U.S. Cl. . 257/203; 257/208; 257/211; 257/E23.145; 257/E23.168; 326/41

(58) Field of Classification Search ............... None
See application file for complete search history.

(56) References Cited

U.S. PATENT DOCUMENTS

| | | | |
|---|---|---|---|
| 4,384,399 A | 5/1983 | Kuo | |
| 4,649,413 A | 3/1987 | Kelly | |
| 6,426,650 B1 | 7/2002 | Dufour et al. | |
| 6,445,065 B1 | 9/2002 | Gheewala et al. | |
| 6,476,635 B1 | 11/2002 | Rahim et al. | |
| 6,633,182 B2 | 10/2003 | Pileggi et al. | |
| 6,674,661 B1 * | 1/2004 | Becker | 365/104 |
| 6,771,528 B2 | 8/2004 | Jeung et al. | |
| 7,446,532 B1 * | 11/2008 | Burns | 324/318 |
| 7,589,362 B1 * | 9/2009 | Argyres et al. | 257/208 |
| 7,842,975 B2 * | 11/2010 | Becker et al. | 257/204 |
| 8,072,003 B2 * | 12/2011 | Becker et al. | 257/206 |
| 2003/0042930 A1 | 3/2003 | Pileggi et al. | |
| 2005/0186714 A1 | 8/2005 | Wang | |
| 2009/0106723 A1 | 4/2009 | Malekkhosravi et al. | |
| 2010/0108978 A1 | 5/2010 | Venkatasamy et al. | |
| 2010/0264955 A1 | 10/2010 | Wang | |

OTHER PUBLICATIONS

Malcolm A. White; "Single Mask Layer Programming"; Corrent Corporation, SNUG, San Jose; 2005; 20 pages.

* cited by examiner

*Primary Examiner* — Alonzo Chambliss
(74) *Attorney, Agent, or Firm* — Meyertons Hood Kivlin Kowert & Goetzel, P.C.; Jeffrey C. Hood (57) ABSTRACT

An integrated circuit may include one or more cells, with each cell comprising a first and a second input terminal, a first and a second output terminal, and a number of connection stages configured to couple each input terminal to a corresponding respective output terminal. The stages may include one stage per metal layer of the integrated circuit and one stage per VIA layer of the integrated circuit. Each stage may be configured with a pair of input ports and a pair of output ports. Each output port of a stage may serially connect to a corresponding respective input port of a first adjacent stage, and each input port of the stage may also serially connect to a corresponding respective output port of a second adjacent stage. The pair of input ports may also be configured to programmably connect to the pair of output ports within the same stage, according to one of two different connection patterns, to establish a respective connection within the stage. A combination of the respective connections within the stages may determine which input terminal of the cell connects to which output terminal of the cell.

31 Claims, 6 Drawing Sheets

(Port List Table – part 1)

| SIGNAL NAME | TYPE | SIZE | ACTIVE | DESCRIPTION |
|---|---|---|---|---|
| EXTERNAL PORTS | | | | |
| INA | Input | 1 | - | Input A into the cell, any external cell or supply can be tied to this port. |
| INB | Input | 1 | - | Input B into the cell, any external cell or supply can be tied to this port. |
| OUTA | Output | 1 | - | Output A of the cell, can connect to any input of any external cell. |
| OUTB | Output | 1 | - | Output B of the cell, can connect to any input of any external cell. |
| INTERNAL PORTS | | | | |
| M1A | Output | 1 | - | Metal 1 programmable port. |
| M1B | Output | 1 | - | Metal 1 programmable port. |
| M1AU | Input | 1 | - | Metal 1 programmable port. |
| M1BU | Input | 1 | - | Metal 1 programmable port. |
| M2AD | Output | 1 | - | Metal 2 programmable port. |
| M2BD | Output | 1 | - | Metal 2 programmable port. |
| M2AU | Input | 1 | - | Metal 2 programmable port. |
| M2BU | Input | 1 | - | Metal 2 programmable port. |
| M3AD | Output | 1 | - | Metal 3 programmable port. |
| M3BD | Output | 1 | - | Metal 3 programmable port. |
| M3AU | Input | 1 | - | Metal 3 programmable port. |
| M3BU | Input | 1 | - | Metal 3 programmable port. |
| M4AD | Output | 1 | - | Metal 4 programmable port. |
| M4BD | Output | 1 | - | Metal 4 programmable port. |
| M4AU | Input | 1 | - | Metal 4 programmable port. |
| M4BU | Input | 1 | - | Metal 4 programmable port. |
| M5AD | Output | 1 | - | Metal 5 programmable port. |
| M5BD | Output | 1 | - | Metal 5 programmable port. |
| M5AU | Input | 1 | - | Metal 5 programmable port. |
| M5BU | Input | 1 | - | Metal 5 programmable port. |
| M6AD | Output | 1 | - | Metal 6 programmable port. |
| M6BD | Output | 1 | - | Metal 6 programmable port. |
| M6A | Input | 1 | - | Metal 6 programmable port. |
| M6B | Input | 1 | - | Metal 6 programmable port. |
| V6AD | Output | 1 | - | Via 56 programmable port. |
| V6BD | Output | 1 | - | Via 56 programmable port. |
| V5AU | Input | 1 | - | Via 56 programmable port. |
| V5BU | Input | 1 | - | Via 56 programmable port. |
| V5AOD | Output | 1 | - | Via 45 programmable port. |

*(Port List Table – part 2)*

| SIGNAL NAME | TYPE | SIZE | ACTIVE | DESCRIPTION |
|---|---|---|---|---|
| INTERNAL PORTS | | | | |
| V5BOD | Output | 1 | - | VIA 45 programmable port. |
| V5AXD | Output | 1 | - | VIA 45 programmable port. |
| V5BXD | Output | 1 | - | VIA 45 programmable port. |
| V4AU | Input | 1 | - | VIA 45 programmable port. |
| V4BU | Input | 1 | - | VIA 45 programmable port. |
| V4AOD | Output | 1 | - | VIA 34 programmable port. |
| V4BOD | Output | 1 | - | VIA 34 programmable port. |
| V4AXD | Output | 1 | - | VIA 34 programmable port. |
| V4BXD | Output | 1 | - | VIA 34 programmable port. |
| V3AU | Input | 1 | - | VIA 34 programmable port. |
| V3BU | Input | 1 | - | VIA 34 programmable port. |
| V3AOD | Output | 1 | - | VIA 23 programmable port. |
| V3BOD | Output | 1 | - | VIA 23 programmable port. |
| V3AXD | Output | 1 | - | VIA 23 programmable port. |
| V3BXD | Output | 1 | - | VIA 23 programmable port. |
| V2AU | Input | 1 | - | VIA 23 programmable port. |
| V2BU | Input | 1 | - | VIA 23 programmable port. |
| V2AOD | Output | 1 | - | VIA 12 programmable port. |
| V2BOD | Output | 1 | - | VIA 12 programmable port. |
| V2AXD | Output | 1 | - | VIA 12 programmable port. |
| V2BXD | Output | 1 | - | VIA 12 programmable port. |
| V1AU | Input | 1 | - | VIA 12 programmable port. |
| V1BU | Input | 1 | - | VIA 12 programmable port. |

*FIG. 8b*

PROGRAMMABLE METAL ELEMENTS AND PROGRAMMABLE VIA ELEMENTS IN AN INTEGRATED CIRCUIT

BACKGROUND OF THE INVENTION

1. Field of the Invention

This invention relates generally to the field of semiconductor circuit design, and more particularly to the design of a programmable metal or VIA element in an integrated circuit layout.

2. Description of the Related Art

Integrated circuits (ICs, also commonly referred to chips) are well known components that can be found in nearly all electronic equipment in use today. The integration of large numbers of small transistors into a single chip represents a sizeable improvement over the assembly of circuits comprising discrete electronic components. Two of the main advantages of ICs over discrete circuits are cost and performance. Cost is reduced because ICs are printed as a unit using photolithography. Consequently, producing a circuit in the form of an IC requires much less material than producing a corresponding circuit built from discrete components. Performance of ICs is high, since the components typically switch quickly and consume little power compared to their discrete counterparts.

The concentration of transistors on ICs has risen over the years, with the first integrated circuits containing transistors numbering in the tens (Small-Scale Integration, or SSI). The next developmental step led to ICs containing hundreds of transistors on each chip (Medium-Scale Integration, or MSI), with further development leading to tens of thousands of transistors per chip (Large-Scale Integration, or LSI), leading to present day ICs comprising anywhere from hundreds of thousands of transistors to a billion transistors (Very Large-Scale Integration, or VLSI). Manufacturing has been tending towards smaller and smaller channel lengths and cleaner fabrication facilities, enabling the production of ICs with more transistors at adequate yields. Design tools have also been steadily improving, successfully reducing design cycles and time to market of various designs, such as microprocessors, graphics processing chips and memories. The most commonly used process is based on the more energy efficient CMOS (Complementary Metal-Oxide Semiconductor), which has replaced NMOS-only and PMOS-only designs to avoid prohibitive increases in power consumption.

In many instances, all the components required for a given digital or computer system may be included on a single IC, which is commonly referred to as System-on-a-Chip (SOC). ICs are typically composed of specific overlapping layers, each defined by photolithography, and normally associated with different colors during the design process. The layers currently defined include the diffusion layer, which specifies where various dopants might be diffused into the substrate, the implant layer, which specifies where additional ions are implanted, the polysilicon and metal layers that constitute the conducting layers, and the VIA (or contact) layer, which defines the connections between the conducting layers. All components are generally constructed from a specific combination of these layers. In a typical CMOS process, a transistor is formed wherever the gate layer (polysilicon or metal) crosses a diffusion layer.

The various layers on an IC are obtained through a process that is akin to a photographic process, but using higher frequency light, typically ultraviolet to create the patterns for each layer. The patterns are ultimately provided in form of a template referred to as a mask, which determines how the various components are configured and interconnected on the IC. Each IC is tested before packaging, typically using automated test equipment, during what is commonly known as wafer testing, or wafer probing. Following wafer probing, each wafer is typically cut into blocks, each block referred to as a die. Each good die is then connected into a package. Since each feature is very small, electron microscopes have become essential tools for process engineers to debug a fabrication process and/or fabricated prototypes. Various methods have also been developed to modify ICs after initial manufacture, without necessarily having to implement each experimental change in a new mask, or without having to make major modifications to obtain a new mask.

One solution for modifying an IC after fabrication is the use of focused ion beam machines (FIB, for short), which employ a technique for site-specific analysis, deposition, and removal of portions of various layers on a manufactured IC. Because of its sputtering capability, the FIB is oftentimes used as a micro-machining tool, to modify or otherwise machine materials at the micro- and nano-scale. FIB machines are often used in the semiconductor industry to patch or modify portions of an existing IC. For example, the gallium beam generated in the FIB machine is used to cut unwanted electrical connections, or to deposit conductive material in order to make a connection in an IC. Due to ever shrinking design cycles and time-to-market requirements, it has become important to have the capability to easily and quickly program various portions of an IC, such as a revision id register, for example, when making modifications to an IC after initial manufacture. However, the problem of programming on any single metal layer or any single VIA layer an infinite number of times, without having to make considerable layout modifications (or modifications to the production mask) has not yet been properly addressed.

Many other problems and disadvantages of the prior art will become apparent to one skilled in the art after comparing such prior art with the present invention as described herein.

SUMMARY OF THE INVENTION

As used herein, the term "VIA" is used to refer to a small opening in an insulating oxide layer on an integrated circuit (IC) that allows metallic interconnect on different interconnect layers to form a connection. In other words, VIA is to be interpreted as it is commonly used in reference to integrated circuit design, and more specifically in reference to connecting metal strips (or other conducting strips) on different metal (or other conductive) layers to be connected together.

In one set of embodiments, an IC may be configured to allow for easy and quick programming of at least a portion of the IC, for example an identification (ID) register, when making modifications on the IC after initial manufacture. The IC may comprise one or more Metal VIA Programmable Switch (MVPSW) elements or cells, which may be configured to forward two signals through as many stages as there are conductive layers, e.g. metal layers, and contact layers, e.g. VIA layers in the targeted IC process, before exiting the cell. Each stage may have two inputs and two outputs allowing either of the two inputs to be connected to each output. Since each stage may be connected serially to a next stage, and any one stage may effectively be programmed to swap the connection between its two inputs and two outputs, the overall path through which the signals are forwarded may be swapped by modifying only one cell, and the modifications may additively determine the final path of the two signals.

Each stage in the MVPSW may be implemented in a different conductive (e.g. metal layer) and contact (e.g. VIA)

layer so that there is one stage per metal layer and one stage per VIA layer of the IC. Each stage may be connected serially to another stage, and two possible connections may be used within any one stage. The combination of these connections throughout all the stages may determine which inputs of the MVPSW are connected to which outputs of the MVPSW. Without modifying any other stage, swapping the connection between the two inputs within any stage (level) may result in switching the respective outputs of the MVPSW from one input of the MVPSW to the other input of the MVPSW.

Many current solutions, such as ROM cells typically require programming on a single specific VIA layer. In addition ROMs are typically not fully static, and they require precharging circuits and an output stage to generate CMOS compatible signaling. Other solutions such as reprogrammable FPGA type elements generally use extra logic to be able to generate the desired function on power up, and still require some other form of memory to store the program. Unlike these current solutions, the MVPSW is programmable at any single metal layer (level) or any single VIA layer (level), and is self-contained without requiring any other components to be reprogrammed. Various embodiments of the MVPSW cells may also be designed as fully static cells.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

In one set of embodiments, a metal or VIA programmable switch (MVPSW) cell may be configured to provide a way to reprogram the cell's outputs following initial manufacture. The reprogramming may consist of an electronic change order (ECO) to include changes to any single conductive layer, such as metal layer or any single contact layers, such as VIA layer in a production mask, or a modification to the top layer metal using a focused ion beam (FIB) machine. As illustrated by a conceptual circuit 100 of at least a section of an MVPSW in FIG. 1, it may be possible to connect OUTA 106 to INA 102, and OUTB 108 to INB 104, or connect OUTA 106 to INB 104 and OUTB 108 to INA 102 by changing the connection type on any single stage or multiple stages. The stages may be configured in metal layers and VIA layers, with each stage representing either a programmable metal layer or a programmable VIA layer. Circuit 100 may be configured to have one output connected to one input, to prevent shorting the outputs or inputs together.

Figure 1:
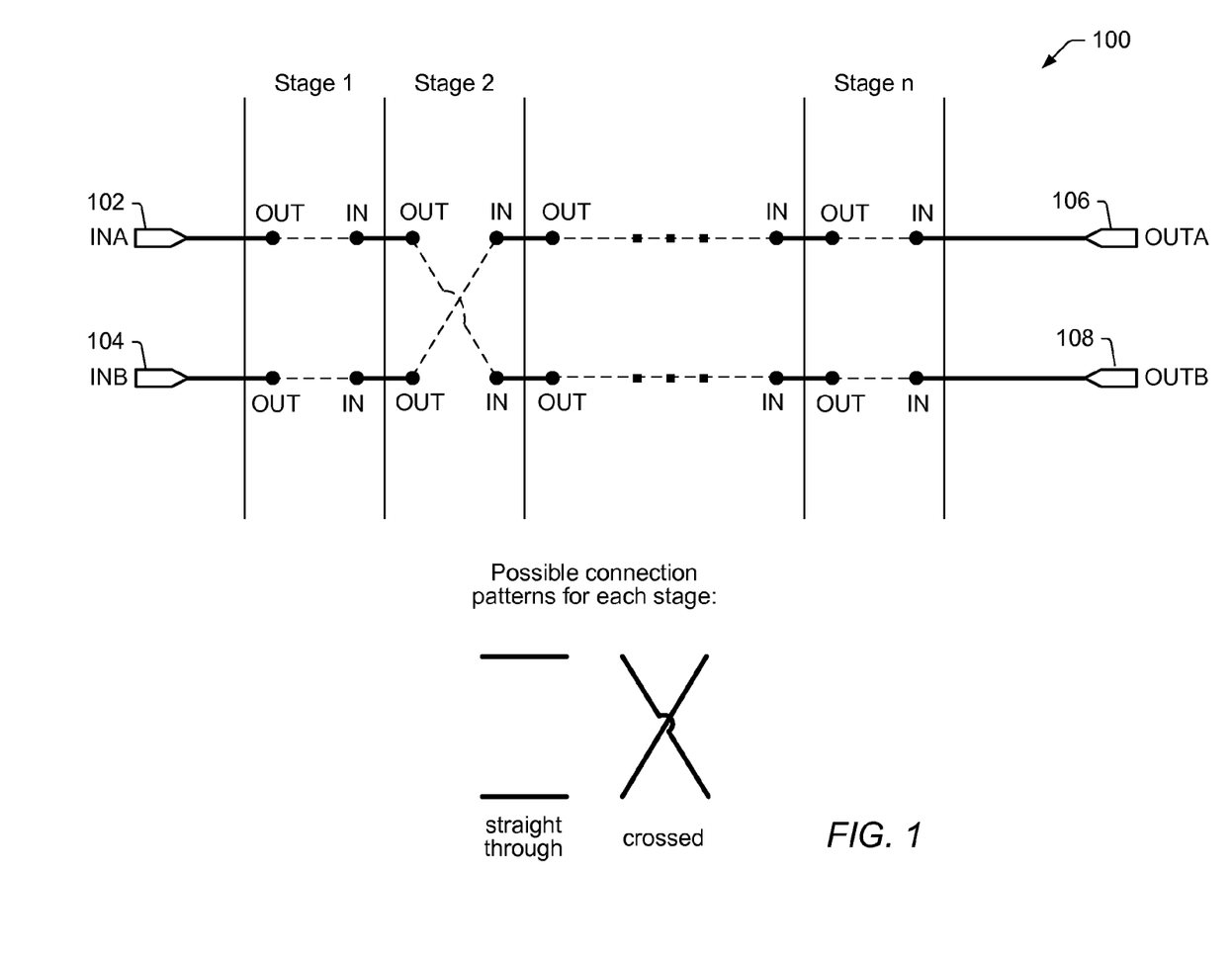
FIG. 1 is a top level conceptual diagram of one embodiment of a Metal Via Programmable Switch Element (MVPSW), showing one stage per metal layer and VIA layer.

Two possible connections types may be used to make the input to output connections within a stage: straight through connections and crossed connections. By using straight through connections and crossed connections, shorting of the outputs and inputs of the cell may be avoided. Other types of connections, however may be possible, and are contemplated. The dashed lines in FIG. 1 illustrate one possible connection combination of connections within the given stages. In the illustrated example, INA is actually coupled to OUTB, and INB is coupled to OUTA. As shown in FIG. 1, swapping out the connection type within any one single stage from a straight-through connection to a crossed connection will result in the input-output connections being switched. For example, if the connection in stage 1 were changed from the straight-through connection shown to a crossed connection, INA would then be connected to OUTA, and INB would be connected to OUTB.

Figure 2:
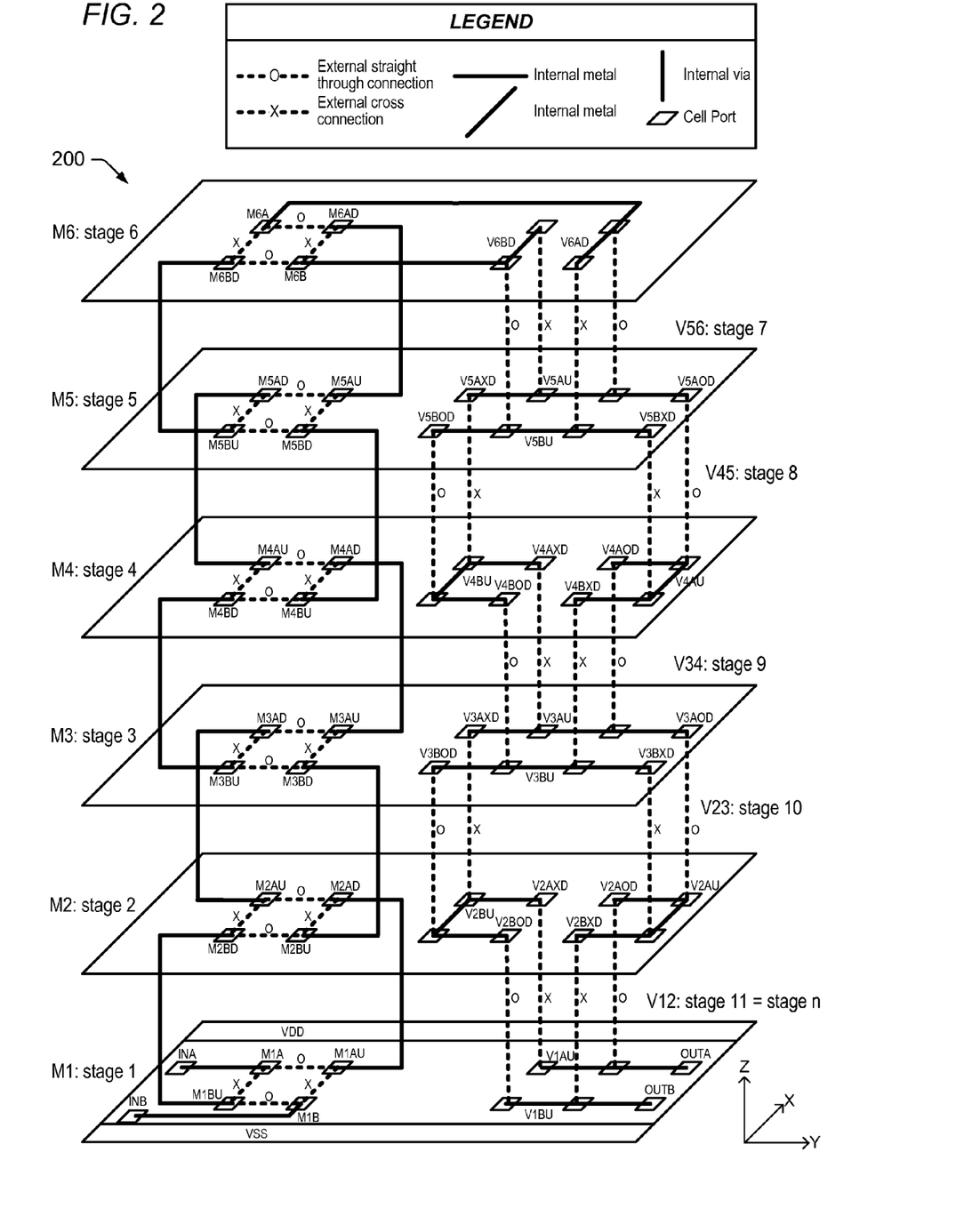
FIG. 2 is a physical layout diagram of one embodiment of a MVPSW over six metal layers.

The conceptual circuit 100 may easily be mapped onto a physical cell by mapping each stage to a metal layer and VIA layer (VIA represents metal-to-metal connections) of the targeted fabrication process. One embodiment of such a mapping is illustrated in FIG. 2. Cell 200 may comprise six metal layers, M1 through M6, and five VIA layers, VIA 1-to-2 (V12, for short) through VIA 5-to-6 (V56, for short). Those skilled in the art will appreciate that alternate embodiments may comprise less or more metal layers depending on the fabrication process, and the embodiments described herein are not meant to limit the scope of all possible embodiments to six metal layers. As shown in FIG. 2, internal metal connections are illustrated by horizontal and 45°-angle connecting lines, and internal VIA connections are illustrated by vertical connecting lines. The input ports (INA and INB) may be routed into the cell on metal layer M1 at stage 1, and may continue up all the metal layers until they reach metal layer M6 at stage 6. At this point, the connection may wind back down through all the VIA layers starting at V56 at stage 7 down to V12 at stage 11, at which point it may reach metal layer M1 again, where the output ports (OUTA and OUTB) may be configured. The vertical flow of the stages makes it possible to minimize the cell's area.

Figure 8A:
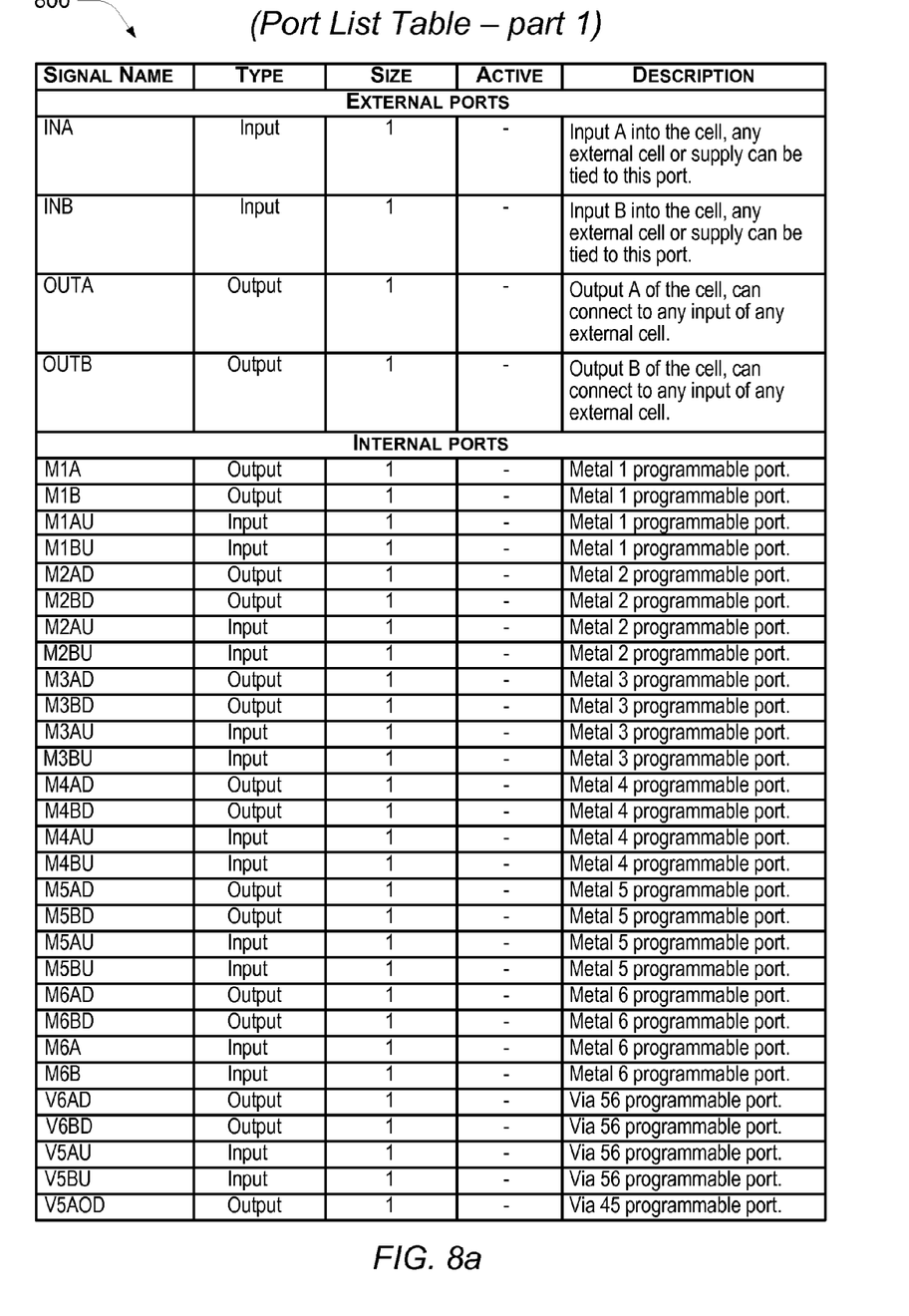
FIGS. 8a and 8b show a table providing a detailed listing of all internal and external ports for the embodiment of FIG. 2.
Figure 8B:
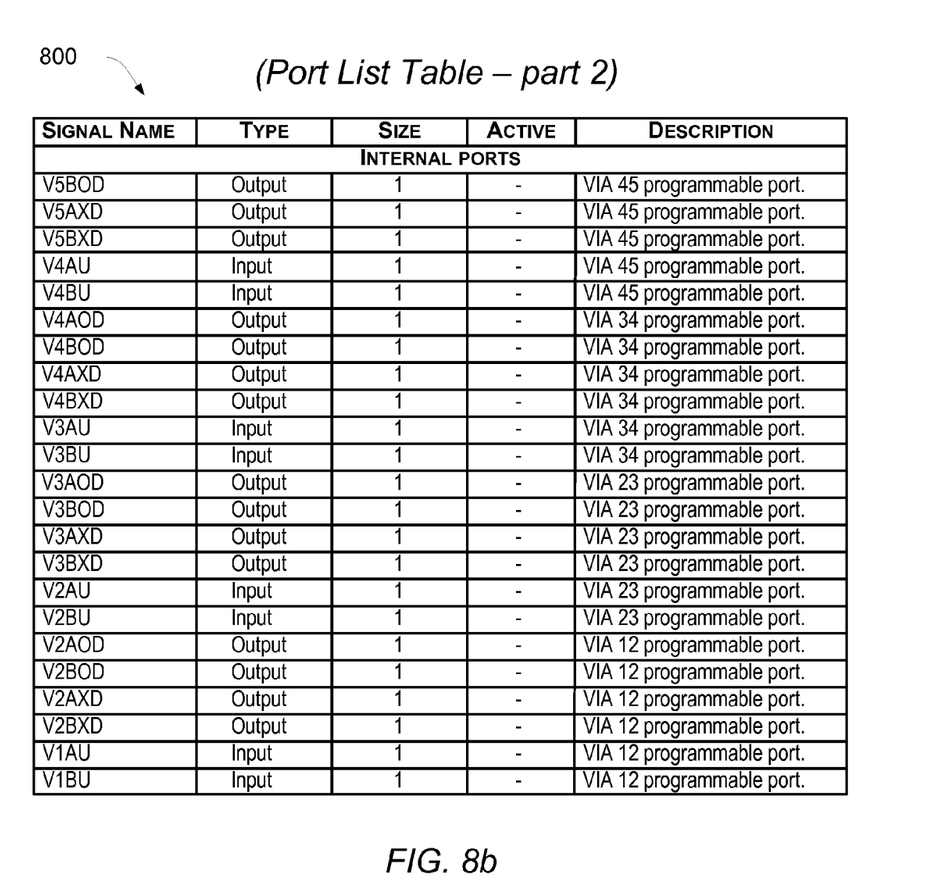

The left side of FIG. 2 shows the metal layer ports, which may be used for metal programming. The ports are indicated as "Mx", where "x" provides information indicating the metal layer where the port is configured (1-6), the port ID (A or B), and whether the port connects upwards or downwards (U or D, respectively). A detailed listing of all internal and external ports—including input ports and output ports—for the embodiment shown in FIG. 2 can be found in table 800 shown in FIG. 8a/b. Each of the metal program stages may connect to the next metal program stage in a crisscross pattern of VIA couplings, which may be internal vertical wires within cell 200, as also illustrated in FIG. 2. By configuring the vertical VIAs, the external metal connections may be made without literally having to cross the connections (it should be noted that in various embodiments, programming may require two connections at any given stage), yet outputs OUTA and OUTB may still effectively be crossed. The dotted lines on each metal layer, M1 through M6, may represent the external metal connections for metal-only programming. There may be two possible connections on each of the illustrated metal layers. The connections marked with an "O" (2 connections), correspond to connections for programming the cell (hence referred to as "external connections") with a pass-through connection. The connections marked with an "X" (2 connections), correspond to connections for programming the cell with a cross connection, which may effectively connect OUTA with what was previously connected to OUTB, and what was previously connected to OUTB with what was previously connected to OUTA.

The right side of FIG. 2 shows the VIA ports, which may be used for VIA programming. The ports are indicated as "Vx", where, "x" provides information indicating the metal layer on which the VIA is configured (1-6), the port ID (A or B), whether the port connects upwards or downwards (U or D, respectively) where applicable, and whether the port connects using a pass-through type or crisscross type connection (O or X, respectively) where applicable. As previously mentioned, detailed listing of these ports for the embodiment shown in FIG. 2 can be found in table 800 shown in FIG. 8a/b. Each of the VIA couplings in V23 through V45 may be configured with eight ports, allowing each Vx port to be connected to one other Vx port to provide a uniquely named connection between two Vx ports. Consequently, since only modified Vx ports may be affected by any required modifications, Electronic Change Orders (ECOs—indicating where changes in the mask may be required) may be easier to implement. If multiple Vx ports had the same connection name, then all Vx ports may be affected. Once again, the connections marked with an "O" correspond to connections for programming the cell with a pass-through connection, and the connections marked with an "X" correspond to connections for programming the cell with a cross connection, as described above with regards to the metal programming.

Figure 3:
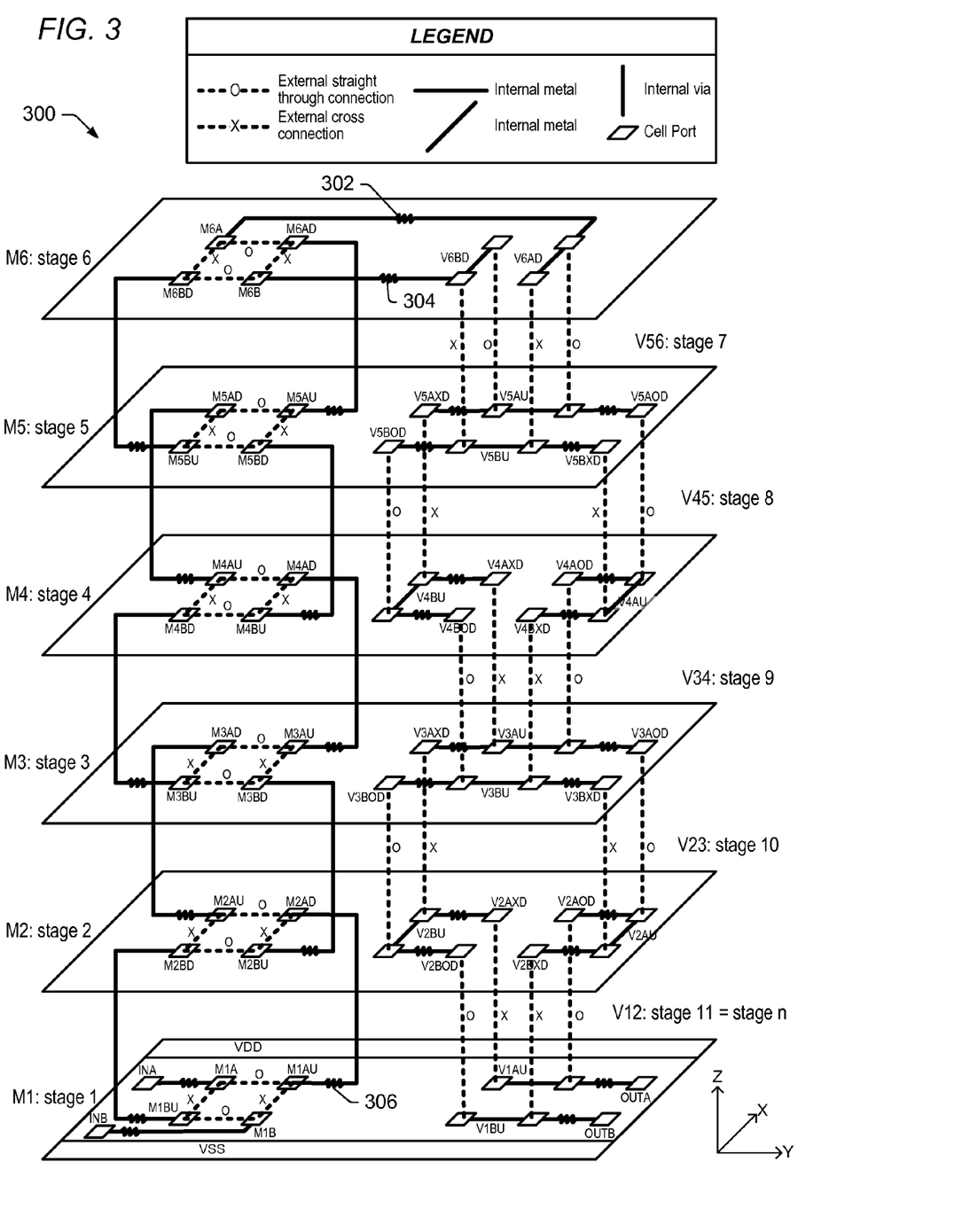
FIG. 3 is a physical layout diagram of one embodiment of a MVPSW over six metal layers, including resistors for use with a layout versus schematic (LVS) verification tool.

It should be noted that "programming" here denotes the specifying of what external connections should be made between which ports upon manufacture. These connections are referred to as "external connections" to denote that they do not represent permanent connectivity when contrasted to the "internal connections", and they do not represent connections that are physically external to the chip. In other words, as used herein, "external connections" are meant to reference the connections configured to be the programmable connections for modifying the cell. The internal connections together with the external connections may define a conducting path between each input port and output port of the pair of input ports and output ports (A and B). As previously mentioned, (referring to FIGS. 1-3), the conducting paths may be INA to OUTA and INB to OUTB, or INA to OUTB and INB to OUTA. The connections denoted by the dashed lines and labeled "O" and "X" in FIGS. 2 and 3 represent the connections that may be programmed for each layout/mask revision to establish the final conducting paths between the pair of input ports and pair of output ports. The internal connections may never need to be changed.

Furthermore, once two initial conducting paths have been established, it may be possible to alter the two conducting paths by simply making one revision in either one of the metal layers or one of the VIA layers, by disconnecting/connecting respective "O" and "X" connections. The respective ports in each layer may be programmed to establish two connections between specified ports in that layer, with either both connections programmed as pass-through ("O") to obtain two respective straight paths, or both connections programmed as crossed ("X") to obtain two respective crossed paths. The Mx ports and Vx ports may therefore be programmable to establish the desired conducting paths as described above, and as further discussed below.

Metal Programming

Metal programming may be controlled by external connections (metal running in the X and Y directions, referencing the XYZ axis shown in FIG. 2) made to the Mx ports of the cell. Each of these Mx ports may connect to one other Mx port on the same metal layer. For example, to program a pass-through connection on metal 3, M3AD may be connected to M3AU, and M3BD may be connected to M3BU. Similarly, to program a cross connection on metal 3, M3AD may be connected to M3BU, and M3BD may be connected to M3AU. To reverse a connection on, for example metal 5, to effectively swap OUTA and OUTB assuming metal 5 had a pass-through connection that had already been made, M5AD may be disconnected from M5AU, M5BD may be disconnected from M5BU, M5AD may be connected to M5BU, and M5BD may be connected to M5AU.

Via Programming

Via programming may be controlled by external connections (VIA couplings running in the Z direction, again referencing the XYZ axis shown in FIG. 2) made to the Vx ports of the cell. Each of these Vx ports may connect to one other Vx port on the metal layer above or below. For example, to program a pass-through connection with V23, V2AU may be connected to V3AOD, and V2BU may be connected to V3BOD. Similarly, to program a cross connection with V23, V2AU may be connected to V3BXD, and V2BU may be connect to V3AXD. To reverse a connection with V23 to effectively swap OUTA and OUTB, assuming that V23 had a pass-through connection that had already been made, V2AU may be disconnected from V3AOD, V2BU may be disconnected from V3BOD, V2AU may be connected to V3BXD, and V2BU may be connected to V3AXD.

Fib Programming

FIB programming may be controlled by external connections (metal running in the X and Y directions, again referencing the XYZ axis shown in FIG. 2) to the M6x ports of the cell, which represent the top metal layers of the cell. For example, to reverse a connection with a FIB to effectively swap OUTA and OUTB assuming metal 6 had a pass through connection that had already been made, M6AD may be disconnected from M6A, M6BD may be disconnected from M6B, M6AD may be connected to M6B, and connect M6BD to M6A. To reverse a connection with a FIB to effectively swap OUTA and OUTB, assuming metal 6 had a cross connection that had already been made, M6AD may be disconnected from M6B, M6BD may be disconnected from M6A, M6AD may be connected to M6A, and M6BD may be connected to M6B.

Use of Design Tools: Synthesis, Static Timing Constraints, and Layout Considerations FIG. 3 shows a physical layout diagram of one embodiment of a MVPSW cell over six metal layers, showing resistors that may be included when a layout versus schematic (LVS) verification tool is used. Cell structure 300 shown in FIG. 3 is essentially the same as structure 200 shown in FIG. 2, with the exception of resistors (e.g. marked resistors 302, 304 and 306), which may be added when required by an LVS tool to properly interpret the different port names. In preferred embodiments, MVPSW cells may not be targeted by synthesis and may instead be manually instantiated, to make sure that the synthesis tool does not optimize the cells away.

The use of many MVPSW cells within a chip may result in routing congestion, since MVPSW cells may use up all available metal layers. Therefore, if only a few MVPSW cells are included on an IC, it may be preferable to space them in a manner that avoids forming a wall of blockage. If blockage remains an issue, is or if many MVPSW cells are configured on the chip, the MVPSW cells may be placed into an isolated region of the die that is not critical. In all other cases, MVPSW cells may be automatically placed and routed, and may require no special provisions. MVPSW cells may be configured to consume no power, while containing the Vdd and Vss tracks like any other standard core cells, to allow Vdd and Vss to pass through to other cells.

Hard Coded ID Modification

Figure 4:
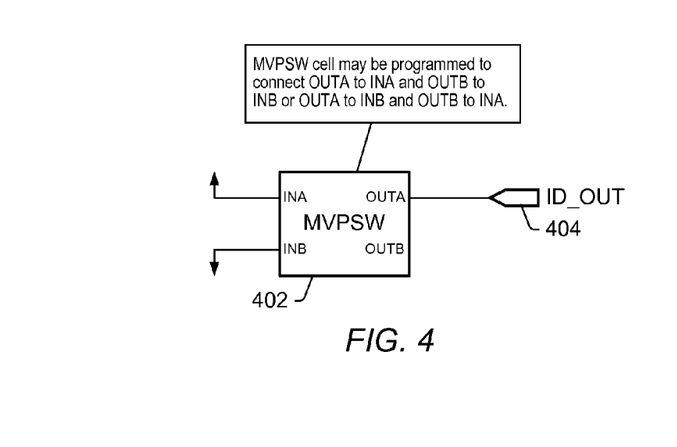
FIG. 4 is a block diagram of one embodiment of a one-bit application of a MVPSW.

Among other things, the MVPSW cell may be used for storing revision bits used to uniquely identify different silicon revisions. Every time an ECO is made to fix part of a chip, the chip's revision bits may need to be updated to uniquely identify the change. By using the MVPSW cell, the revision may be modified on the same layer for which the ECO is made. This can save money by reducing the number of masks that may otherwise need to be modified. In addition, manufacturing time may be also be reduced since there would be no requirement for the revision changes to be made in layers lower than the layer for which the ECO has been made. Each modified lower layer may add to the overall manufacturing time. One embodiment of a MVPSW cell 402 used for storing revision ID information is shown in FIG. 4. Output 404 may be used to provide one output bit comprised in an ID number corresponding to revision information. The MVPSW cell may also be used to easily change the device ID of a chip if the same chip is being used for multiple customers. A separate mask layer may be made for each customer during manufacture.

Register Bit Default Modification

Figure 5:
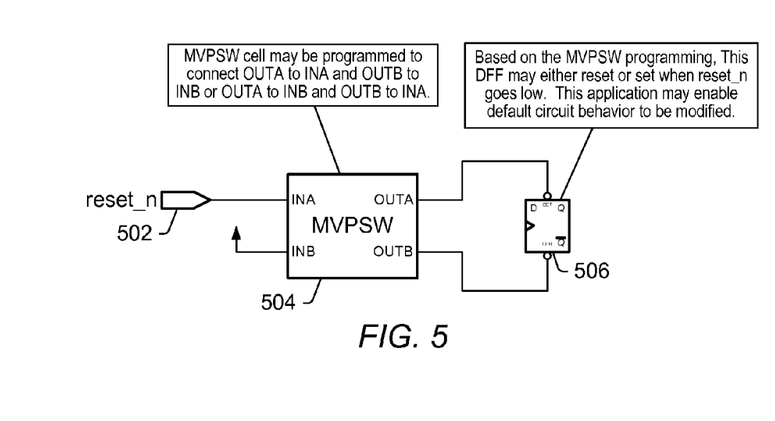
FIG. 5 is a block diagram of register bit default modification in one embodiment of a MVPSW.

Register bits may be either high or low by default. However, certain customers may request different default values, and it may still be preferable to use the same circuit for such customers. By using the MVPSW cell, it may be possible to change this requirement at manufacture time. One mask may be used for programming the default register requirements for all customers. One embodiment of a MVPSW cell 502 configured for programming required register default values is shown in FIG. 5. By programming MVPSW cell 504 to connect OUTA to INA and OUTB to INB, or OUTA to INB and OUTB to INA, DFF 506 may either reset or set when signal 502 goes low, based on the programming of MVPSW cell 504. Therefore, using MVPSW cells may enable default circuit behavior to be modified.

Register Bit Output Modification

Figure 6:
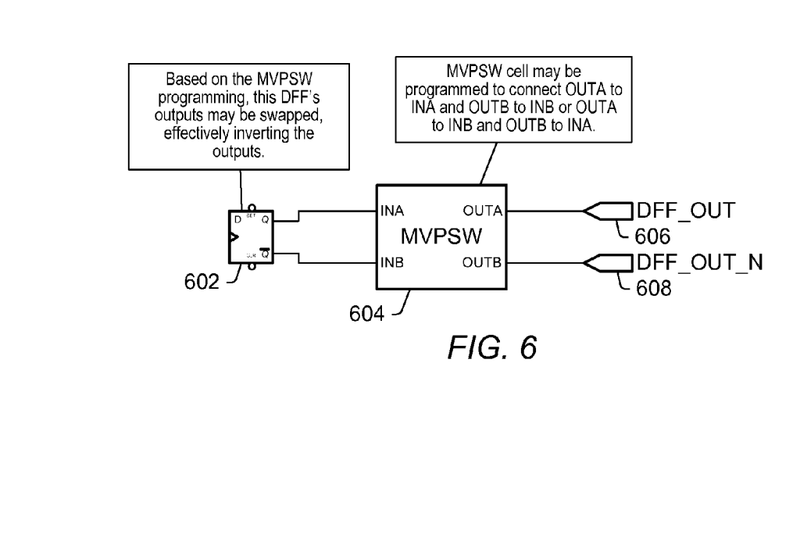
FIG. 6 is a block diagram of register bit output inversion in one embodiment of a MVPSW.

It may also be possible to invert the output or select register bits by using a MVPSW cell. One embodiment of a MVPSW cell 604 configured to perform this function is shown in FIG. 6. The outputs Q and QB of register 602 may be configured to drive the inputs of MVPSW cell 604. The outputs of MVPSW cell 604 may be connected to the destination of the outputs of register 602. By programming MVPSW cell 604 to connect OUTA to INA and OUTB to INB, or OUTA to INB and OUTB to INA, the outputs of register 602 may be swapped, effectively inverting the outputs 606 and 608.

Multi-Circuit Choice

Figure 7:
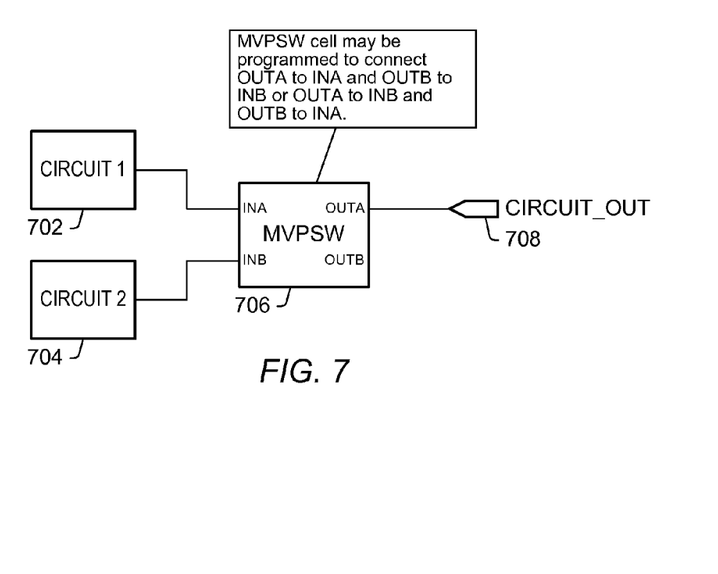
FIG. 7 is a block diagram of one embodiment of a multi-circuit application using one embodiment of a MVPSW.

There may be cases where the same chip will be manufactured for multiple customers, but each customer may require a particular function to be implemented somewhat differently. In such cases, an MVPSW cell may be used to choose between two circuits, each corresponding to a different implementation of a given function. One embodiment of a MVPSW cell 706 configured to choose between two different functions is shown in FIG. 7. By programming MVPSW cell 704 to connect OUTA to INA and OUTB to INB, or OUTA to INB and OUTB to INA, output 708 may be configured to provide either the output of circuit 1 (702) or the output of circuit 2 (704).

Integration

Since the MVPSW cell has so many ports, it may be challenging to integrate it into the overall design of an IC. However, when instantiated in a register transfer language (RTL), the MVPSW cell may always use the same pass-through connections between the Mx ports and the Vx ports. These connections may only need to be changed when requesting ECOs, and only one stage would have to be modified, (for example, metal 3 programming may only involve 4 ports). The integrator of the cell may only need to work with the inputs INA and INB, and the outputs OUTA and OUTB. The integration process may be further simplified by using an RTL wrapper that hides all the Mx and Vx ports, and only allows connections to the INA, INB, OUTA, and OUTB ports. The wrapper may handle all the pass-through program connections for the integrator. A parameter may also be added to define how many cells are to be instantiated.

Chip-Level Considerations

Since an MVPSW cell may be configured with no active devices, it may not require output drivers. When designing an MVPSW cell, the inputs may be appropriately buffered based on the expected load on the MVPSW cell. The cell's inputs may be tied high or low, which may be accomplished through inverters in certain embodiments. MVPSW cells may work well not only for device ID and revision registers (and other uses as discussed above), but also for various other applications, and they may be configured in any circuit where metal programmability is required and/or preferred.

Although the embodiments above have been described in considerable detail, other versions are possible. For example, alternate embodiments may be configured with more than two input/output ports per cell, with alternate configurable conducting paths established according to the principles set forth herein. In addition, MVPSW cells may be combined to obtain the desired number of inputs/outputs and corresponding conducting paths while retaining single layer programmability as also set forth herein. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. An integrated circuit comprising:
   a plurality of layers disposed vertically with respect to each other, wherein each layer comprises a respective plurality of ports;
   a pair of main input ports configured on a first layer of the plurality of layers; and
   a pair of main output ports configured on the first layer;
   wherein the respective plurality of ports of each layer are programmable to establish:
      a first conductive path between one of the pair of main inputs ports and either one of the pair of main output ports, for conducting electrical signals between the one of the pair of main input ports and the either one of the pair of main output ports; and
      a second conductive path between a remaining one of the pair of main inputs ports and a remaining one of the pair of main output ports, for conducting electrical signals between the remaining one of the pair of main input ports and the remaining one of the pair of main output ports;
   wherein the first conductive path and the second conductive path both pass through each layer.

2. The integrated circuit of claim 1, wherein the respective plurality of ports of each layer are further programmable to modify:
   a first section of the first conductive path to disconnect the one of the pair of main inputs ports from the either one of the pair of main output ports and connect it to the remaining one of the pair of main output ports, for conducting electrical signals between the one of the pair of main input ports and the remaining one of the pair of main output ports; and
   a first section of the second conductive path to disconnect the remaining one of the pair of main inputs ports from the remaining one of the pair of main output ports and connect it to the one of the pair of main output ports, for conducting electrical signals between the remaining one of the pair of main input ports and the either one of the pair of main output ports;
   wherein the first section of the first conductive path and the first section of the second conductive path are both comprised on a same single layer of the plurality of layers.

3. The integrated circuit of claim 1, wherein the plurality of ports of each layer are further programmable to modify:
   a first section of the first conductive path to disconnect the one of the pair of main inputs ports from the either one of the pair of main output ports and connect it to the remaining one of the pair of main output ports, for conducting electrical signals between the either one of the pair of main input ports and the remaining one of the pair of main output ports; and
   a first section of the second conductive path to disconnect the remaining one of the pair of main inputs ports from the remaining one of the pair of main output ports and connect it to the one of the pair of main output ports, for conducting electrical signals between the remaining one of the pair of main input ports and the either one of the pair of main output ports;
   wherein the first section of the first conductive path and the first section of the second conductive path are both comprised between a same two single layers of the plurality of layers.

4. The integrated circuit of claim 1, wherein the first layer is a bottom layer of the plurality of layers.

5. The integrated circuit of claim 1, wherein the plurality of layers are metal layers, and wherein the respective plurality of ports of each layer are VIAs.

6. The integrated circuit of claim 1, wherein for each single layer of the plurality of layers:
   the respective plurality of ports of the single layer comprise a pair of input ports corresponding to the pair of main input ports, and a pair of output ports corresponding to the pair of main output ports, wherein each port of the pair of input ports of the single layer is configured to:
      permanently connect to a respective corresponding port of the pair of output ports of an adjacent layer above the single layer; and
      programmably connect to either port of the pair of output ports of the single layer.

7. The integrated circuit of claim 6, wherein for each single layer of the plurality of layers:
   each port of the pair of output ports of the single layer is configured to:
      permanently connect to a respective corresponding port of the pair of input ports of an adjacent layer underneath the single layer; and
      programmably connect to either port of the pair of input ports of the single layer.

8. The integrated circuit of claim 7, wherein for the first layer:
   each port of the pair of output ports of the first layer is configured to permanently connect to a respective corresponding port of the pair of main input ports.

9. The integrated circuit of claim 1, wherein for each single layer of the plurality of layers:
   the respective plurality of ports of the single layer comprise a set of input ports corresponding to the pair of main input ports, and a set of output ports corresponding to the pair of main output ports, wherein each port of the set of input ports of the single layer is configured to:
      permanently connect to at least two respective corresponding ports of the set of output ports of the single layer; and
      programmably connect to a respective corresponding port of the set of output ports of an adjacent layer above the single layer.

10. The integrated circuit of claim 9, wherein for each single layer of the plurality of layers:
    each port of the set of output ports of the single layer is configured to:
       permanently connect to a respective corresponding port of the set of input ports of the single layer; and
       programmably connect to a respective corresponding port of the set of input ports of an adjacent layer underneath the single layer.

11. The integrated circuit of claim 10, wherein for the first layer:
    each port of the set of input ports of the first layer is configured to permanently connect to a respective corresponding port of the pair of main output ports.

12. An integrated circuit comprising:
    a cell comprising:
       a plurality of layers disposed vertically with respect to each other, wherein each layer comprises a respective plurality of ports;
       a pair of main input ports configured on a first layer of the plurality of layers; and
       a pair of main output ports configured on the first layer;
       wherein the respective plurality of ports of each layer are programmable to establish:

a first conductive path between one of the pair of main inputs ports and either one of the pair of main output ports, for conducting electrical signals between the one of the pair of main input ports and the either one of the pair of main output ports; and
a second conductive path between a remaining one of the pair of main inputs ports and a remaining one of the pair of main output ports, for conducting electrical signals between the remaining one of the pair of main input ports and the remaining one of the pair of main output ports;
wherein the first conductive path and the second conductive path both pass through each layer; and
one of:
a first latch having:
  a first input terminal configured to receive a set signal, wherein the first input terminal of the latch is coupled to one of the pair of main output ports of the cell; and
  a second input terminal configured to receive a clear signal, wherein the second input terminal of the latch is coupled to the remaining one of the pair of main output ports of the cell; and
  wherein one of the pair of main input ports of the cell is configured to receive a reset signal to reset the latch;
a second latch having:
  a non-inverting output coupled to one of the pair of main input ports of the cell; and
  an inverting output coupled to the remaining one of the pair of main input ports of the cell;
  wherein one of the pair of main output ports of the cell corresponds to either one of the non-inverting output and inverting output of the second latch; and
  wherein the remaining one of the pair of main output ports of the cell corresponds to the remaining one of the non-inverting output and inverting output of the second latch; or
a first circuit having an output terminal coupled to one of the pair of main input ports of the cell, and a second circuit having an output terminal coupled to the remaining one of the pair of main input ports of the cell, wherein one of the pair of main output ports of the cell corresponds to either one of the output terminal of the first circuit and the output terminal of the second circuit.

13. An integrated circuit configured to be reprogrammable after initial manufacture, the integrated circuit comprising:
a first main input and a first main output;
a second main input and a second main output; and
a plurality of connection stages comprising one connection stage per metal layer of the integrated circuit and one connection stage per VIA layer of the integrated circuit, wherein each connection stage is adjacent to two other connection stages, except a first connection stage and a last connection stage which are each adjacent to one other connection stage;
wherein each connection stage comprises a first and second input port and a first and second output port;
wherein the first main input is coupled to the first output port of the first connection stage, and the second main input is coupled to the second output port of the first connection stage;
wherein, the first main output is coupled to the first input port of the last connection stage, and the second main output is coupled to the second input port of the last connection stage;
wherein the first and second input port of each single connection stage, except the first and second input port of the last connection stage, are serially connected to the first and second output port, respectively, of a first one of two connection stages adjacent to the single connection stage;
wherein the first and second output port of each single connection stage, except the first and second output port of the first connection stage, are serially connected to the first and second input port, respectively, of the remaining one of the two connection stages adjacent to the single connection stage;
wherein the first and second input port of each single connection stage are each configured to programmably connect to a respective one of the first and second output port of the single connection stage according to one of at least two different types of connection patterns to establish a respective connection within the single connection stage; and
wherein a combination of the respective connections established within each connection stage throughout the plurality of connection stages determines which of the first main input and second main input is coupled to which of the first main output and the second main output.

14. The integrated circuit of claim 13, wherein modifying the respective connection within a given connection stage from one type of the at least two different types of connection patterns to another one of the at least two different types of connection patterns, without modifying any of the other connection stages, results in:
switching the connection of the first main input from the one of the first main output and second main output to which it is connected to the other one of the first main output and second main output; and
switching the connection of the second main input from the one of the first main output and second main output to which it is connected to the other one of the first main output and second main output.

15. The integrated circuit of claim 13, wherein the first connection stage is comprised in a bottom metal layer, and the last connection stage is comprised in a bottom VIA layer between the bottom metal layer and an adjacent metal layer configured over the bottom metal layer.

16. The integrated circuit of claim 13, wherein for each single connection stage comprised in a metal layer, the first and second input port and the first and second output port of the single connection stage are configured on the metal layer.

17. The integrated circuit of claim 16, wherein the first and second input port and the first and second output port of the single connection stage are VIAs, wherein the respective connection within the single connection stage comprises connections between VIAs on the metal layer.

18. The integrated circuit of claim 13, wherein for each single connection stage comprised in a VIA layer, the first and second input port and the first and second output port of the single connection stage are configured on two adjacent metal layers.

19. The integrated circuit of claim 18, wherein the first and second input port and the first and second output port of the single connection stage are VIAs, wherein the respective connection within the single connection stage comprises connections between VIAs of the two adjacent metal layers.

20. An integrated circuit comprising:
one or more cells, wherein each cell comprises:
  a first and a second input terminal;
  a first and a second output terminal;
  a plurality of connection stages configured to couple each of the first and the second input terminal to a corresponding respective one of the first and second output terminal, wherein the plurality of connection stages comprise one connection stage per metal layer of the integrated circuit and one connection stage per VIA layer of the integrated circuit, wherein each connection stage comprises a pair of input ports and a pair of output ports;

wherein each of the pair of output ports of a single connection stage is serially connected to a corresponding respective one of the pair of input ports of a first adjacent connection stage;

wherein each of the pair of input ports of the single connection stage is serially connected to a corresponding respective one of the pair of output ports of a second adjacent connection stage;

wherein the pair of input ports of the single connection stage are configured to programmably connect to the pair of output ports of the single connection stage according to one of two different connection patterns, to establish a respective connection within the single connection stage;

wherein a combination of the respective connections within the plurality of connection stages determines which of the first and the second input terminal connects to which of the first and the second output terminal.

21. The integrated circuit of claim 20, wherein the two connection patterns comprise:
a straight-through pattern; and
a crossed pattern.

22. The integrated circuit of claim 20, wherein the pair of input ports and the pair of output ports of each connection stage of each cell comprise VIAs.

23. The integrated circuit of claim 20, wherein the first and the second input terminal and the first and the second output terminal of each cell are configured on a bottom metal layer of the integrated circuit.

24. The integrated circuit of claim 20, wherein switching the respective connection within any single connection stage of any cell from one of the two connection patterns to the other one of the two connection patterns, without modifying any of the other connection stages, disconnects each of the first and the second input terminal from the respective one of the first and the second output terminal to which it is connected, and connects it to the other one of the first and the second output terminal.

25. The integrated circuit of claim 20, further comprising one or more of:
at least two circuits having respective outputs, each respective output coupled to a respective one of the first and the second input terminals of a first respective cell, to programmably assign the respective outputs of the at least two circuits to the first and the second output terminals of the first respective cell;
at least two additional circuits having respective inputs, each respective input coupled to a respective one of the first and the second output terminals of a second respective cell, to programmably assign the respective inputs of the at least two circuits to the first and the second input terminals of the second respective cell.

26. An integrated circuit comprising:
one or more programmable cells, each cell configured to forward two signals through as many stages as there are conductive layers and contact layers in a targeted fabrication process of the integrated circuit, before the two signals exit the cell;
wherein each stage comprises two inputs and two outputs, wherein each stage is configured to programmably connect the two inputs to the two outputs within the stage according to one of at least two different connection patterns;
wherein each stage is serially connected to a next stage; and
wherein each cell comprises:
a pair of cell inputs serially connected to the respective outputs of a first stage, and configured to respectively receive the two signals; and
a pair of cell outputs serially connected to the respective inputs of a last stage, and configured to respectively output the two signals.

27. The integrated circuit of claim 26, wherein each stage is configured to programmably connect one of the two inputs to either one of the two outputs, and programmably connect the other of the two inputs to the remaining one of the two outputs, within the stage.

28. The integrated circuit of claim 26, wherein the targeted fabrication process is a CMOS process, the conductive layers are metal layers, and the contact layers are VIA layers.

29. The integrated circuit of claim 26, further comprising one or more of:
a first latch having:
a first input terminal configured to receive a set signal, wherein the first input terminal of the latch is coupled to one of the pair of cell outputs of a first cell; and
a second input terminal configured to receive a clear signal, wherein the second input terminal of the latch is coupled to the remaining one of the pair of cell outputs of the first cell; and
wherein one of the pair of cell inputs of the first cell is configured to receive a reset signal to reset the latch;
a second latch having:
a non-inverting output coupled to one of the pair of cell inputs of a second cell; and
an inverting output coupled to the remaining one of the pair of cell inputs of the second cell;
wherein one of the pair of cell outputs of the second cell corresponds to either one of the non-inverting output and inverting output of the second latch; and
wherein the remaining one of the pair of cell outputs of the second cell corresponds to the remaining one of the non-inverting output and inverting output of the second latch; or
a first circuit having an output terminal coupled to one of the pair of cell inputs of a third cell, and a second circuit having an output terminal coupled to the remaining one of the pair of cell inputs of the third cell, wherein one of the pair of cell outputs of the third cell corresponds to either one of the output terminal of the first circuit and the output terminal of the second circuit.

30. The integrated circuit of claim 26, wherein for each cell the first stage is configured on a first conductive layer and connects to a next stage configured on a next conductive layer, with each subsequent stage connecting to a next stage on a next conductive layer until a final conductive layer is reached, wherein the stage configured on the final conductive layer is connected to a next stage configured on a contact layer, with each subsequent stage connecting to a next stage on a next contact layer until a final contact layer is reached, wherein the final stage is configured on the final contact layer.

31. The integrated circuit of claim 30, wherein the first conductive layer corresponds to a bottom metal layer, and wherein the final contact layer corresponds a VIA layer between the bottom metal layer and an adjacent metal layer configured above the bottom metal layer.

* * * * *